US012631700B2

(12) United States Patent
Yoshii et al.

(10) Patent No.:  US 12,631,700 B2
(45) **Date of Patent:  *May 19, 2026**

(54) MAGNETIC FIELD MEASUREMENT APPARATUS AND MAGNETIC FIELD MEASUREMENT METHOD

(71) Applicants: SUMIDA CORPORATION, Tokyo (JP); Kyoto University, Kyoto (JP)

(72) Inventors: Yoshiharu Yoshii, Natori City (JP); Tsutomu Otsuka, Natori City (JP); Shingo Hamada, Natori City (JP); Norikazu Mizuochi, Kyoto (JP); Yuki Takemura, Kyoto (JP)

(73) Assignees: Sumida Electric Co., Ltd. (JP); Kyoto University (JP)

( * ) Notice: Subject to any disclaimer, the term of this patent is extended or adjusted under 35 U.S.C. 154(b) by 73 days.

This patent is subject to a terminal disclaimer.

(21) Appl. No.: 18/560,882

(22) PCT Filed: Jun. 7, 2022

(86) PCT No.: PCT/JP2022/022913
§ 371 (c)(1),
(2) Date: Nov. 14, 2023

(87) PCT Pub. No.: WO2023/013234
PCT Pub. Date: Feb. 9, 2023

(65) Prior Publication Data
US 2024/0255594 A1      Aug. 1, 2024

(30) Foreign Application Priority Data
Aug. 3, 2021    (JP) ................................. 2021-127304

(51) Int. Cl.
*G01R 33/26*          (2006.01)
*G01R 33/36*          (2006.01)

(52) U.S. Cl.
CPC ......... *G01R 33/26* (2013.01); *G01R 33/3642* (2013.01)

(58) Field of Classification Search
CPC ............................ G01R 33/26; G01R 33/3642
(Continued)

(56) References Cited

FOREIGN PATENT DOCUMENTS

| JP | H08-75834 | 3/1996 |
| JP | 2020-008298 | 1/2020 |

OTHER PUBLICATIONS

Albrecht et al.; "Narrow-band single photon emission at room temperature based on a single nitrogen-vacancy center coupled to an all-fiber-cavity"; Aug. 20, 2014; Applied Physics Letters; 105, 073113; pp. 1-4 (Year: 2014).*

(Continued)

*Primary Examiner* — Alesa Allgood
*Assistant Examiner* — Rahul Maini

(57)            ABSTRACT

A high-frequency magnetic field generator 2 applies microwave to a magnetic resonance member 1. A magnet 3 applies a static magnetic field to the magnetic resonance member 1. An irradiating device 12 irradiates the magnetic resonance member 1 with incident light of a specific wavelength. An FT 4 senses a measurement target magnetic field using a primary coil 4a and applies an application magnetic field corresponding to the sensed measurement target magnetic field to the magnetic resonance member 1 using a secondary coil 4b. A pillar-shaped light guide member 41 guides the incident light to the magnetic resonance member 1, and a pillar-shaped light guide member 42 guides fluorescence that the magnetic resonance member 1 emits from the magnetic resonance member 1. Further, the magnetic resonance member 1 is arranged between an end surface of the light guide member 41 and an end surface of the light guide (Continued)

member 42 in a hollow part of the secondary coil 4*b* of the FT 4 and in a hollow part of the aforementioned magnet 3.

5 Claims, 7 Drawing Sheets

(58) Field of Classification Search
USPC .......................................................... 324/304
See application file for complete search history.

(56) References Cited

OTHER PUBLICATIONS

Patel et al.; "Subnanotesla Magnetometry with a Fiber-Coupled Diamond Sensor"; Oct. 30, 2020; Physical Review Applied; 14, 044058; pp. 1-10 (Year: 2020).*

\* cited by examiner

MAGNETIC FIELD MEASUREMENT APPARATUS AND MAGNETIC FIELD MEASUREMENT METHOD

TECHNICAL FIELD

The present invention relates to a magnetic field measurement apparatus and a magnetic field measurement method.

BACKGROUND ART

A magnetic measurement apparatus performs magnetic measurement with ODMR (Optically Detected Magnetic Resonance) that uses electron spin resonance of a sensing member such as a diamond structure that includes a nitrogen and a lattice defect (an NV center: Nitrogen Vacancy Center) (See Patent Literature #1, for example). In ODMR, in addition to a measurement target magnetic field, a static magnetic field is applied to a magnetic resonance member such as a diamond that includes such an NV center; laser light (excitation light and measurement light) and microwave are also applied in accordance with a predetermined sequence; and a light intensity is detected of fluorescence emitted from the magnetic resonance member and a magnetic flux density is derived on the basis of the light intensity.

For example, in Ramsey Pulse Sequence, (a) an NV Center is irradiated with excitation light, (b) a first pi/2 pulse of microwave is applied to the NV Center, (c) a second pi/2 pulse of microwave is applied to the NV Center with a predetermined time interval tt from the first pi/2 pulse, (d) the NV Center is irradiated with measurement light, and an emitted light intensity of the NV Center is measured, and (e) a magnetic flux density is derived on the basis of the measured light intensity. Further, in Spin Echo Pulse Sequence, (a) an NV Center is irradiated with excitation light, (b) a first pi/2 pulse of microwave is applied to the NV Center at 0-degree phase of a measurement target magnetic field, (c) a pi pulse of microwave is applied to the NV Center at 180-degree phase of the measurement target magnetic field, (d) a second pi/2 pulse of microwave is applied to the NV Center at 360-degree phase of the measurement target magnetic field, (e) the NV Center is irradiated with measurement light, and an emitted light intensity of the NV Center is measured, and (f) a magnetic flux density is derived on the basis of the measured light intensity.

Further, a magnetic sensor includes a superconducting quantum interference device (SQUID), and a magnetic flux transformer (flux transformer) that detects a measurement target magnetic field using a pickup coil and applies the measurement target magnetic field to the SQUID using an input coil (See Patent Literature #2, for example).

CITATION LIST

Patent Literature

PATENT LITERATURE #1: Japan Patent Application Publication No. 2020-8298.
PATENT LITERATURE #2: Japanese Patent Application Publication No. H8-75834.

SUMMARY OF INVENTION

In the aforementioned magnetic measurement apparatus, the laser light, the microwave, and the static magnetic field are applied to the magnetic resonance member in addition to the measurement target magnetic field, and therefore, respective sets of means for applying the laser light, the microwave, and the static magnetic field are installed around the magnetic resonance member. In order to use a flux transformer when the laser light, the microwave, and the static magnetic field are applied to the magnetic resonance member, a secondary coil of the flux transformer must be arranged without obstructing the application of the laser light, the microwave, and the static magnetic field, and therefore, due to geometrical configuration, it is difficult to effectively apply a magnetic field corresponding to a measurement target magnetic field to a magnetic resonance member.

The present invention has been conceived in view of the aforementioned problem. It is an object of the present invention to obtain a magnetic measurement apparatus and a magnetic measurement method in which a magnetic field corresponding to a measurement target magnetic field is effectively applied to a magnetic resonance member using a flux transformer; a magnetic resonance member, a high-frequency magnetic field generator, and a magnet are easily arranged relatively to a direction of a magnetic flux of the flux transformer; and a space for irradiation of the laser light can be easily secured.

A magnetic field measurement apparatus according to the present invention includes a magnetic resonance member capable of an electron spin quantum operation using microwave, a high-frequency magnetic field generator that applies the microwave to the magnetic resonance member, a magnet that applies a static magnetic field to the magnetic resonance member, an irradiating device that irradiates the magnetic resonance member with incident light of a specific wavelength, a flux transformer that senses a measurement target magnetic field using a primary coil and applies an application magnetic field corresponding to the sensed measurement target magnetic field to the magnetic resonance member using a secondary coil, a pillar-shaped first light guide member that guides the incident light to the magnetic resonance member, and a pillar-shaped second light guide member that guides from the magnetic resonance member fluorescence that the magnetic resonance member emits. Further, the magnetic resonance member is arranged between an end surface of the first light guide member and an end surface of the second light guide member in a hollow part of the secondary coil of the aforementioned flux transformer and in a hollow part of the magnet.

A magnetic measurement method according to the present invention includes the steps of: sensing a measurement target magnetic field using a primary coil of a flux transformer, applying to a magnetic resonance member capable of an electron spin quantum operation using microwave an application magnetic field corresponding to the sensed measurement target magnetic field using a secondary coil of the flux transformer, applying the microwave to the magnetic resonance member, applying a static magnetic field to the magnetic resonance member, guiding incident light of a specific wavelength from an irradiating device to the magnetic resonance member using a pillar-shaped first light guide member, and guiding fluorescence that the magnetic resonance member emits, from the magnetic resonance member using a pillar-shaped second light guide member; and the magnetic resonance member is arranged between an end surface of the first light guide member and an end surface of the second light guide member in a hollow part of the secondary coil of the aforementioned flux transformer and in a hollow part of the magnet.

Advantageous Effect of Invention

By means of the present invention, obtained are a magnetic measurement apparatus and a magnetic measurement method in which a magnetic field corresponding to a measurement target magnetic field is effectively applied to a magnetic resonance member using a flux transformer; a magnetic resonance member, a high-frequency magnetic field generator, and a magnet are easily arranged relatively to a direction of a magnetic flux of the flux transformer; and a space for irradiation of the laser light can be easily secured.

DESCRIPTION OF EMBODIMENTS

Hereinafter, embodiments according to aspects of the present invention will be explained with reference to a drawing.

Embodiment 1

Figure 1:
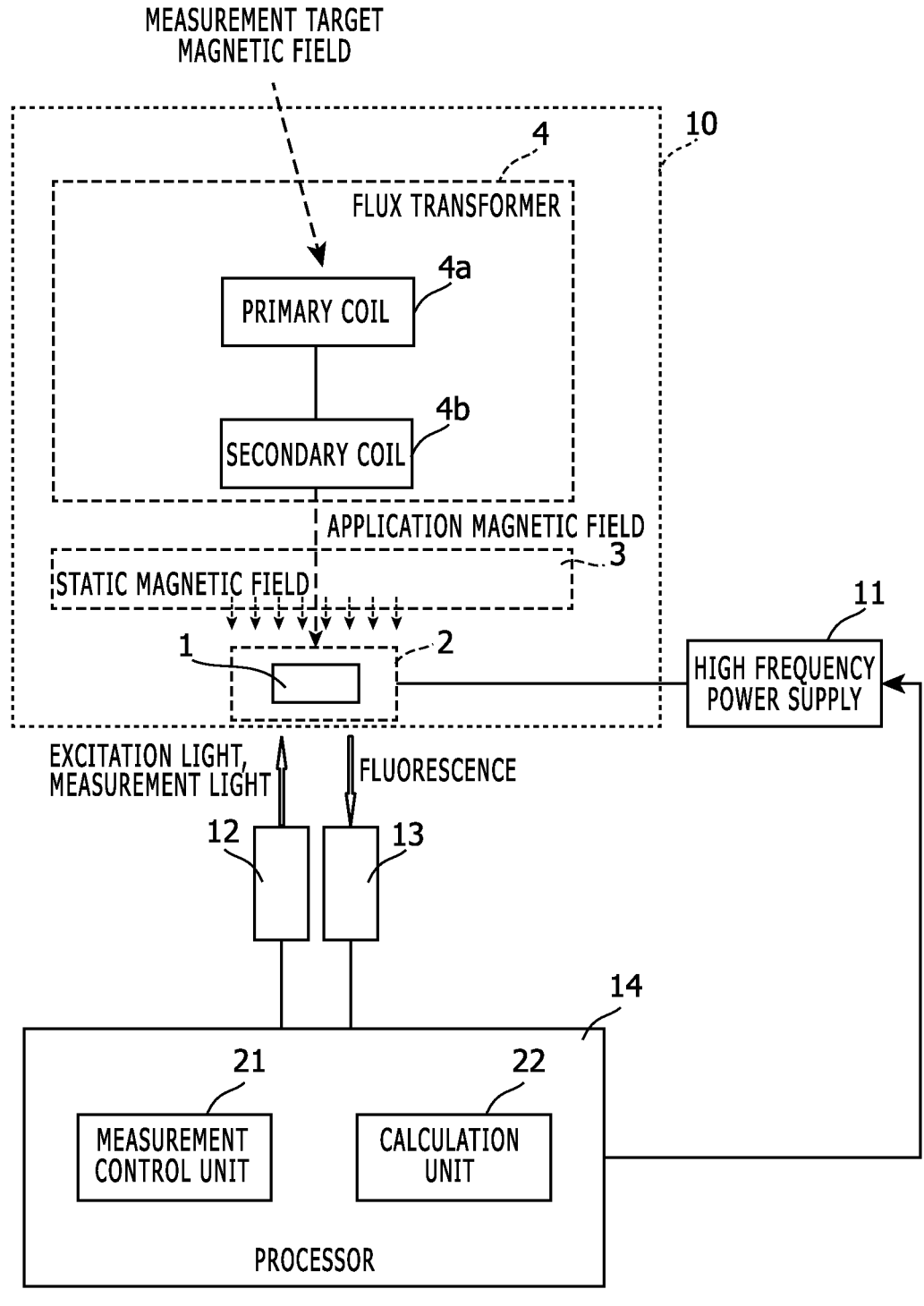
FIG. 1 shows a block diagram that indicates a configuration of a magnetic field measurement apparatus according to an embodiment of the present invention.

FIG. 1 shows a block diagram that indicates a configuration of a magnetic field measurement apparatus according to an embodiment of the present invention. The magnetic field measurement apparatus shown in FIG. 1 includes a magnetic sensor part 10, a high-frequency power supply 11, an irradiating device 12, a light receiving device 13, and a processor 14.

The magnetic sensor unit 10 detects a measurement target magnetic field (e.g. an intensity, a direction, and/or the like) at a predetermined position (e.g. on or over a surface of a test target object). The measurement target magnetic field may be an AC (Alternating Current) magnetic field of a single frequency or an AC magnetic field that includes plural frequency components and has a predetermined period.

In this embodiment, the magnetic sensor unit 10 includes a magnetic resonance member 1, a high-frequency magnetic field generator 2, a magnet 3, and a flux transformer 4.

The magnetic resonance member 1 includes a crystal structure and is capable of electron spin quantum operations (based on Rabi oscillation) with microwave of frequencies corresponding to arrangement orientations of a vacancy and an impurity in a crystal lattice.

In this embodiment, the magnetic resonance member 1 is an optically detected magnetic resonance member that includes plural specific color centers (i.e. color center ensemble). Each of the plural specific color centers has a Zeeman-splittable energy level and can take plural orientations of which energy level shift amounts due to Zeeman splitting are different from each other.

Here the magnetic resonance member 1 is a member such as a diamond including plural NV (Nitrogen Vacancy) centers as specific color centers of a single type. In the NV center, the ground level is a triplet level of Ms=0, +1, −1, and levels of Ms=+1 and Ms=−1 are Zeeman-splittable. It should be noted that color centers included in the magnetic resonance member 1 may be color centers other than NV centers.

The high-frequency magnetic field generator 2 applies the aforementioned microwave to the magnetic resonance member 1.

Further, the magnet 3 applies a static magnetic field (Direct Current magnetic field) to the magnetic resonance member 1. Here, the magnet 3 is a ring-type permanent magnet, for example, a ferrite magnet, an alnico magnet, a samarium-cobalt magnet or the like.

The magnetic resonance member 1 includes plural color centers (here, NV centers) capable of an electron spin quantum operation using the aforementioned microwave, and the magnet 3 applies a substantially uniform static magnetic field to a predetermined area (an irradiation area of excitation light and measurement light) and thereby causes Zeeman splitting to occur on an energy level of plural specific color centers (here, plural NV centers) in the magnetic resonance member 1. For example, the static magnetic field is applied such that in the predetermined area a difference or a ratio between a maximum value and a minimum value of intensity of the static magnetic field gets equal to or less than a predetermined value.

In case of NV center, a color center is formed of a vacancy (hole) (V) and a nitrogen (N) as impurity in a diamond crystal, there are four possible positions (arrangement orientations of the vacancy and the nitrogen) of the nitrogen (N) adjacent to the vacancy (hole) (V) in the diamond crystal, and sub energy levels after Zeeman splitting (i.e. energy levels from the base energy level) corresponding to these positions (i.e. four arrangement orientation) are different from each other. Therefore, in a characteristic of fluorescence intensities to frequencies of the microwave after Zeeman splitting due to the static magnetic field, four dip frequency pairs (fi+, fi−) corresponding to the orientations i (i=1, 2, 3, 4) appear differently from each other. Here, a frequency (a wavelength) of the aforementioned microwave is set correspondingly to any dip frequency among the four dip frequency pairs.

Figure 2:
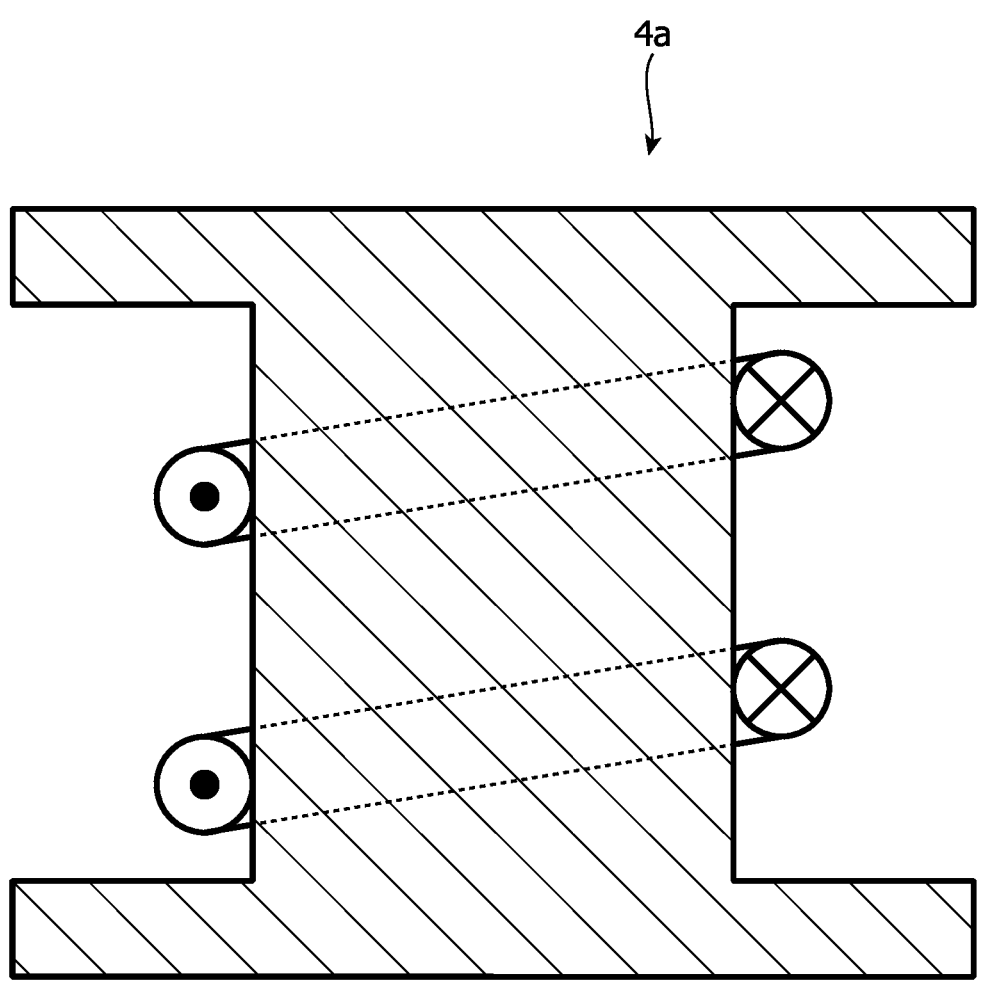
FIG. 2 shows a cross-sectional diagram that indicates a primary coil 4a of a transformer 4 in FIG. 1.
Figure 3:
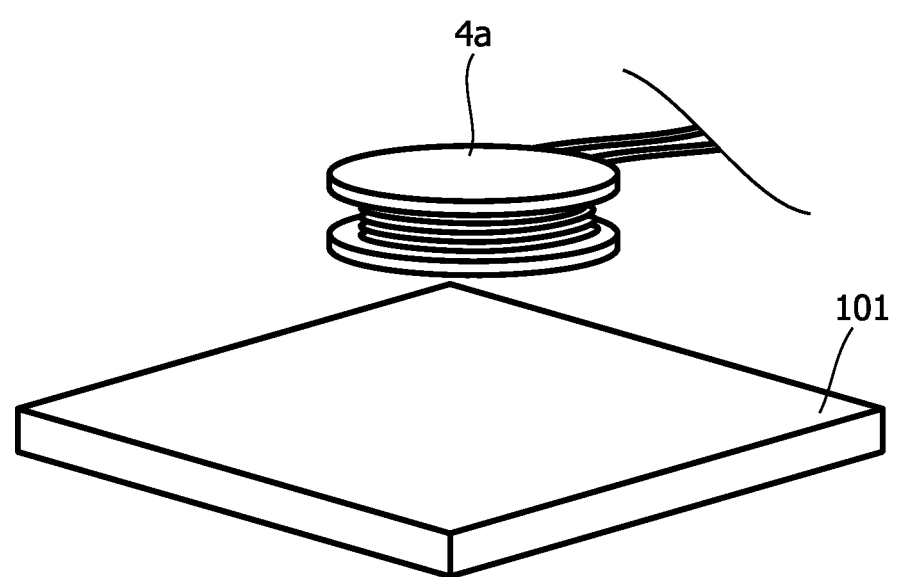
FIG. 3 shows a diagram that explains arrangement of the primary coil 4a of the transformer 4 in magnetic field measurement.

Further, the flux transformer 4 includes a primary coil 4a, and a secondary coil 4b that is electrically connected to the primary coil 4a through a cable (coaxial cable, litz wires, or the like) or the like. As shown in FIG. 2, the primary coil 4a is configured with a winding wire of 0.5 turn to tens of turns. Further, as shown in FIG. 3, a measurement target magnetic field is sensed using the primary coil 4a at a predetermined measurement position, for example, over a test target object 101, and an application magnetic field corresponding to the measurement target magnetic field sensed at the predetermined measurement position (a magnetic field transmitted from the predetermined measurement position by the flux transformer 4) is applied to the magnetic resonance member 1 using the secondary coil 4b. Thus, the primary coil 4a induces an electric signal corresponding to the sensed measurement target magnetic field, and the secondary coil 4b induces the application magnetic field corresponding to this electric signal.

Further, the irradiating device 12 and the light receiving device 13 are installed as a detecting device that detects fluorescence generated by physical phenomena corresponding to the aforementioned application magnetic field.

The irradiating device 12 generates laser light (here, excitation light of a predetermined wavelength and measurement light of a predetermined wavelength for ODMR) with which the magnetic resonance member 1 should be irradiated, and irradiates the magnetic resonance member 1 as an optically detected magnetic resonance member with the laser light through an optical system mentioned below.

Further, the light receiving device 13 receives and detects fluorescence emitted from the magnetic resonance member 1 through the optical system mentioned below in irradiation of the measurement light.

The processor 14 includes a computer, for example, and executes a program using the computer and thereby acts as sorts of processing units. In this embodiment, the processor 14 saves signal data detected optically or electrically into an unshown storage device (memory or the like), and performs control and execution operations as a measurement control unit 21 and a calculation unit 22.

The measurement control unit 21 controls the high-frequency power supply 11 and determines a detection value of the physical phenomenon (here, intensities of the fluorescence) detected by the aforementioned detecting device (here, the irradiating device 12 and the light receiving device 13).

In this embodiment, the measurement control unit 21 controls the high-frequency power supply 11 and the irradiating device 12 in accordance with a predetermined measurement sequence, for example, on the basis of ODMR, and determines a detection light intensity of the fluorescence detected by the light receiving device 13. For example, the irradiating device 12 includes a laser diode or the like as a light source, and the light receiving device 13 includes a photo diode or the like as a photodetector, and the measurement control unit 21 determines the aforementioned detection light intensity on the basis of an output signal of the light receiving device 13, and this output signal is obtained by amplification and/or the like of an output signal of the photodetector.

The calculation unit 22 calculates the measurement target magnetic field (intensity, wave form, or the like) at the aforementioned measurement position on the basis of the detection value obtained by the measurement control unit 21 and saved in the storage device.

It should be noted that the aforementioned measurement sequence is set in accordance with a frequency or the like of the measurement target magnetic field. For example, if the measurement target magnetic field is an AC (alternating current) magnetic field of a relatively high frequency, a Spin Echo sequence (Hahn Echo sequence) is applied as this measurement sequence. The measurement sequence is not limited to this. Further, for example, if the measurement target magnetic field is an AC magnetic field of a relatively low frequency, magnetic field measurement may be performed plural times in one period of the measurement target magnetic field in accordance with Ramsey pulse sequence (i.e. a measurement sequence for a DC (Direct Current) magnetic field), and the measurement target magnetic field (intensities, waveform or the like of it) may be determined on the basis of magnetic field measurement results.

Hereinafter details of the magnetic sensor unit 10 is explained.

Figure 4:
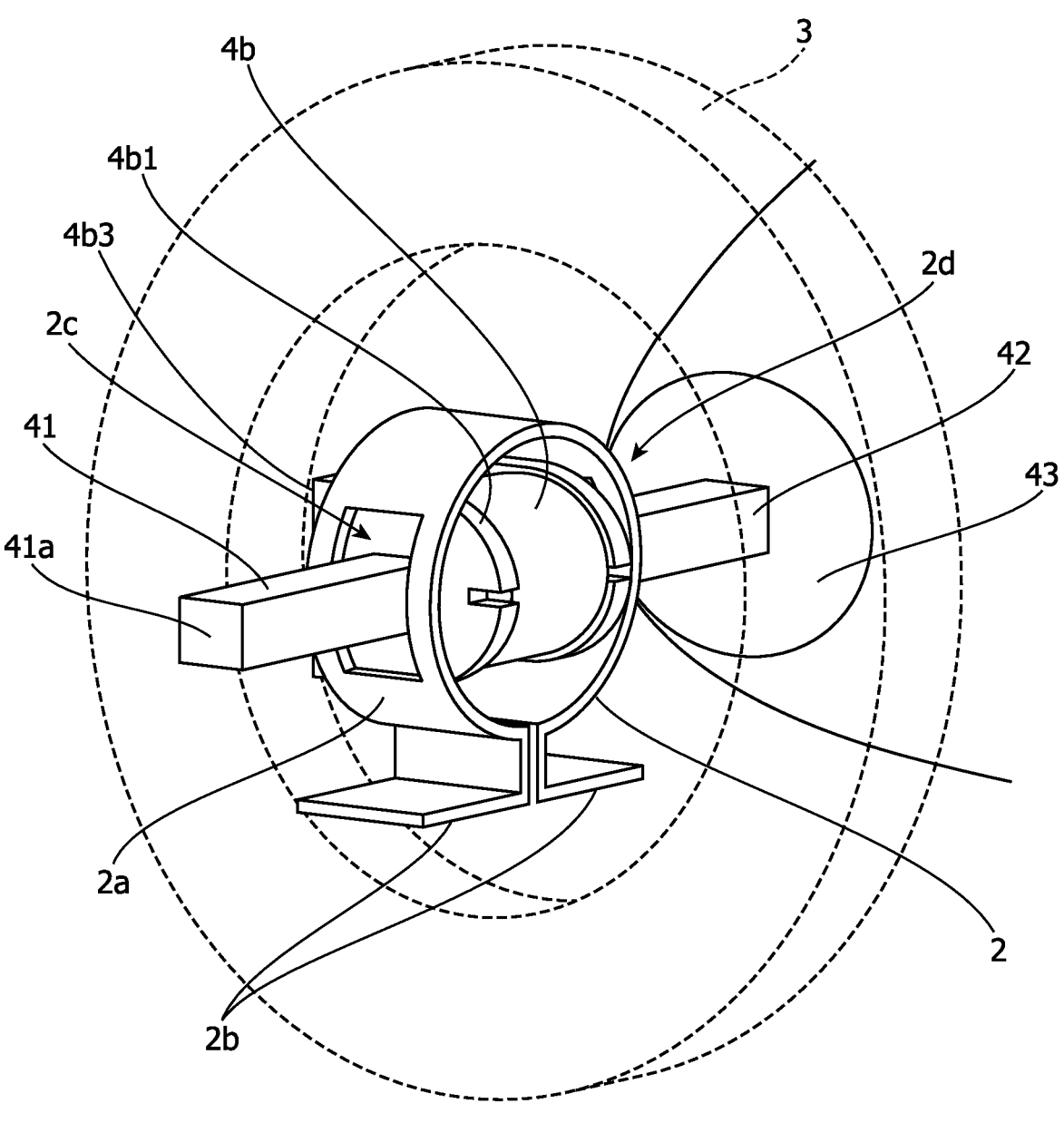
FIG. 4 shows a perspective-view diagram that indicates an example of a configuration of a magnetic sensor part 10 shown in FIG. 1.
Figure 5:
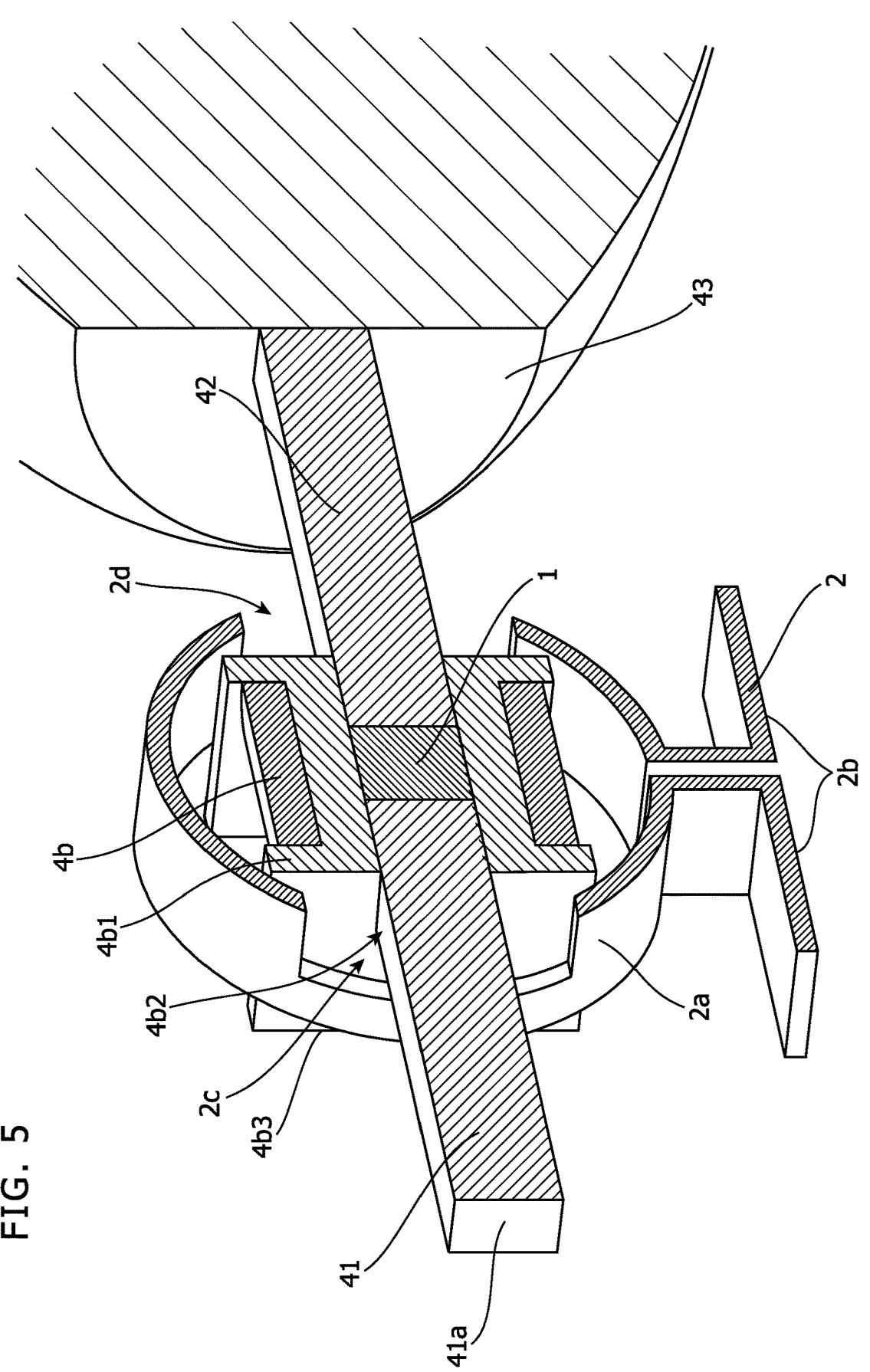
FIG. 5 shows a perspective-view cross-sectional diagram that indicates an example of a configuration of the magnetic sensor part 10 shown in FIG. 1.
Figure 6:
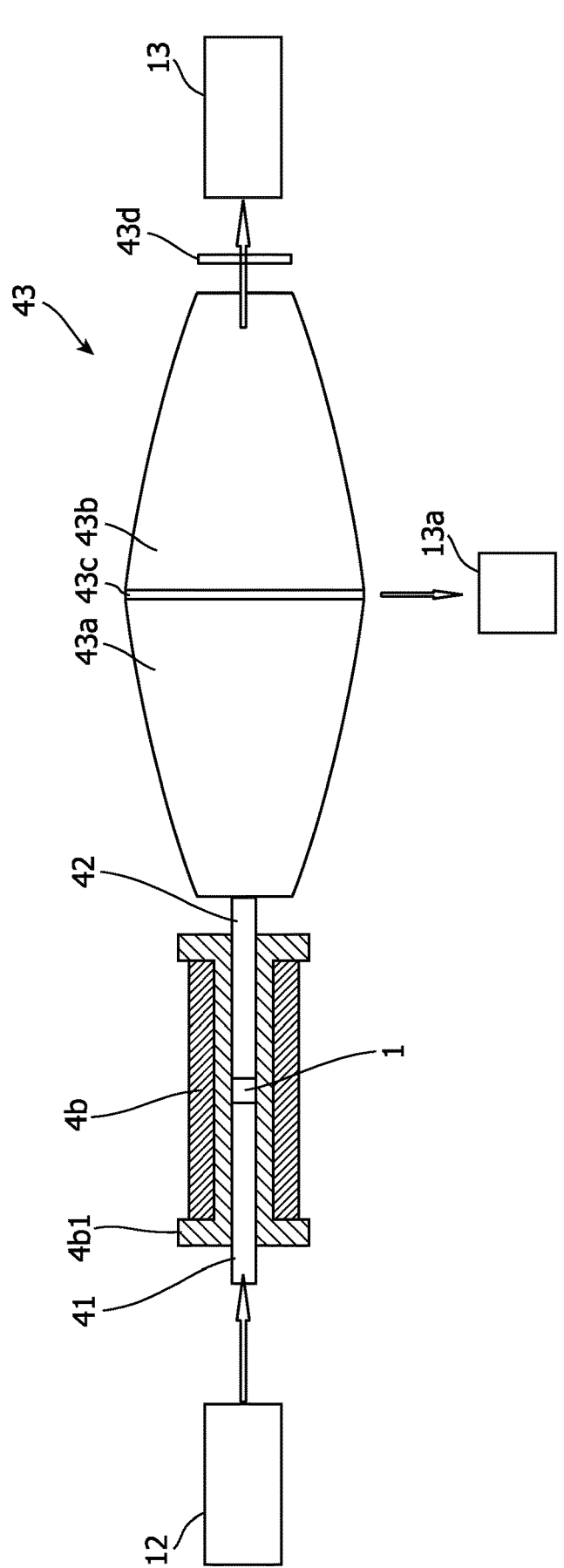
FIG. 6 shows a side-view diagram that indicates an example of a configuration of an optical system in the magnetic sensor part 10 shown in FIG. 1.

FIG. 4 shows a perspective-view diagram that indicates an example of a configuration of a magnetic sensor part 10 shown in FIG. 1. FIG. 5 shows a perspective-view cross-sectional diagram that indicates an example of a configuration of the magnetic sensor part 10 shown in FIG. 1. FIG. 6 shows a side-view diagram that indicates an example of a configuration of an optical system in the magnetic sensor part 10 shown in FIG. 1.

In this embodiment, as shown in FIGS. 4 and 5, for example, the high-frequency magnetic field generator 2 is a plate coil, and includes a substantially coil part 2a of a substantially circular shape that outputs microwave to its hollow part, and terminal parts 2b that extend from both ends of the coil part 2a and are fixed to an unshown substrate or the like. The high-frequency power supply 11 generates a current for the microwave, and causes the high-frequency magnetic field generator 2 to conduct the current. The coil part 2a of the high-frequency magnetic field generator 2 conducts two flows of current parallel to each other with a predetermined gap on its both end surfaces such that the magnetic resonance member 1 is arranged between the two flows, and thereby outputs the aforementioned microwave. Here, although the high-frequency magnetic field generator 2 is a plate coil, the current flows in end surface parts of the coil part 2a due to skin effect, and thereby the two flows of the current is formed.

Further, as shown in FIGS. 4 to 6, the magnetic sensor part 10 further includes a bobbin 4b1 around which the secondary coil 4b is winded, and light guide members 41 and 42.

The light guide member 41 is a transparent pillar-shaped (here, quadrangular-pillar-shaped) member, and guides incident light from the irradiating device 12 to the magnetic resonance member 1. The light guide member 42 is a transparent pillar-shaped (here, quadrangular-pillar-shaped) member, and guides fluorescence that the magnetic resonance member 1 emits, from the magnetic resonance member 1 to the light receiving device 13. The light guide members 41 and 42 are glass members, for example, and have cross sections of same shapes in a perpendicular direction to longitudinal directions of them.

The magnetic resonance member 1 is arranged between an end surface of the light guide member 41 and an end surface of the light guide member 42 in a hollow part of the secondary coil 4b of the flux transformer 4 and in a hollow part of the magnet 3.

Specifically, the magnetic resonance member 1 has a planer shape as a substantial cuboid; one of two surfaces opposite to each other of the magnetic resonance member 1 makes surface contact or makes surface joining (using an adhesive) with an end surface of the light guide member 41; and the other of the two surfaces makes surface contact or makes surface joining (using an adhesive) with an end surface of the light guide member 42. Consequently, the light guide members 41 and 42 and the magnetic resonance member 1 are arranged on a straight line.

The secondary coil 4b is winded so as to get a ring shape around the nonmagnetic bobbin 4b1 with a predetermined turn ratio to the primary coil 4a, and as shown in FIGS. 4 and 5, for example, the secondary coil 4b winded around the bobbin 4b1 is arranged in a hollow part of the substantially circle-and-plate-shaped coil part 2a in the high-frequency magnetic field generator 2. The bobbin 4b1 includes a through hole 4b2 along a center axis of the secondary coil 4b. Further, (a bottom surface 4b3 of) the bobbin 4b1 is fixed to a structure such as substrate such that (a center of) the through hole 4b2 is arranged at a center of the coil part 2a of the high-frequency magnetic field generator 2 and substantially perpendicular to the center axis of the coil part 2a.

Further, opening parts 2c and 2d are formed on side surfaces of the substantially circle-and-plate shaped coil part 2a in the high-frequency magnetic field generator 2, and the opening parts 2c and 2d are located at positions along an axis direction of the secondary coil 4b in a view from the secondary coil 4b, and in a direction substantially perpendicular to the center axis direction of the coil part 2a, the positions face each other through a center of the coil part 2a.

Consequently, a direction of the microwave (magnetic field) by the high-frequency magnetic field generator 2 gets substantially perpendicular to a direction of the magnetic field by the secondary coil 4b. It should be noted that it is favorable that an angle between the direction of the microwave (magnetic field) by the high-frequency magnetic field generator 2 and the direction of the magnetic field by the secondary coil 4b is set in a range between (90−8) degrees and (90+8) degrees, and it is most favorable that the angle is set as 90 degrees.

It should be noted that sizes of the opening parts 2c and 2d are decided on the basis of a size of irradiation area in the magnetic resonance member 1 and a size of an area through which current due to skin effect flows in the coil part 2a. In this embodiment, the irradiation area in the magnetic resonance member 1 is set to be a rectangular or a circle, and the plate coil of the high-frequency magnetic field generator 2 has a substantial circle shape, and therefore, the opening parts 2c and 2d have rectangular shapes curved as circular arc, and the opening parts 2c and 2d are designed such that a square measure of a projection area of the opening parts 2c and 2d to the magnetic resonance member 1 is larger than a square measure of the irradiation area and the projection area includes the irradiation area.

Further, the plate-shaped magnetic resonance member 1 and the pillar-shaped light guide members 41 and 42 are arranged in the through hole 4b2 and in the opening parts 2c and 2d, and at least the light guide members 41 and 42 (or the magnetic resonance member 1 and the light guide members 41 and 42) are supported to and fixed to the through hole 4b2.

Furthermore, in this embodiment, as shown in FIG. 4, the magnet 3 is a ring-type magnet, the secondary coil 4b is winded of a ring shape, a center axis of the magnet 3 and a center axis of the secondary coil 4b are identical to each other, and the magnetic resonance member 1, the light guide member 41, and the light guide member 42 are arranged on the center axes.

For example, as shown in FIG. 4, the aforementioned magnetic resonance member 1 is located at a position in a hollow part of the secondary coil 4 of this flux transformer 4 and in a hollow part of the magnet 3. Further, in this embodiment, the secondary coil 4b is arranged in the hollow part of the magnet 3. In respective transverse sections perpendicular to the center axis of the magnet 3 and the center axis of the secondary coil 4b, the magnetic resonance member 1 is arranged in a center area of a radius (=a radius of the transverse section×a %) from its center point. In particular, it is favorable that the magnetic resonance member 1 is arranged at the center point. Here, the "a" is equal to or less than 30, more favorably equal to or less than 20, further more favorably equal to or less than 10, more favorably equal to or less than 5.

Therefore, in this embodiment, an application direction of the aforementioned application magnetic field by the secondary coil 4b is identical to an application direction of the aforementioned static magnetic field by the magnet 3, and applying the aforementioned static magnetic field gains fluorescence intensity variation at the aforementioned dip frequency and results in a high sensitivity.

Further, a crystal in the magnetic resonance member 1 is formed and an orientation of the magnetic resonance member 1 is set so as to cause an arrangement direction of the aforementioned vacancy and impurity to be substantially identical to a direction of the aforementioned static magnetic field (and a direction of the application magnetic field) in the magnetic resonance member 1.

It should be noted that it is favorable that an angle (absolute value) between the aforementioned arrangement direction of the vacancy and the impurity and the aforementioned direction of the static magnetic field (and the direction of the application magnetic field) is equal to or less than 8 degrees and it is most favorable that the angle is 0 degree. Further, it is favorable that an angle (absolute value) between the aforementioned direction of the static magnetic field and the direction of the application magnetic field is equal to or less than 8 degrees and it is most favorable that the angle is 0 degree.

Further, in a direction of the center axis of the magnet 3, the magnetic resonance member 1 is arranged in a center section of a width of the ring-type magnet 3. Here, this "center section" means a space within +/− (its center-axis length ½×b %) along the center axis of the ring-type magnet 3 from a center point of the center axis. Here, the "b" is equal to or less than 30, more favorably equal to or less than 20, further more favorably equal to or less than 10, more favorably equal to or less than 5.

Further, in this embodiment, the magnetic resonance member 1 is arranged at a center of a width of the ring-type magnet 3 (i.e. the magnetic resonance member 1 is arranged at a position of substantially same distances from both end surfaces of the magnet 3). Furthermore, in a direction of the center axis of the secondary coil 4b, the magnetic resonance member 1 is arranged in a "center section" of a width of the secondary coil 4b. Here, the "center section" means a space within +/− (its center-axis length ½× c %) along the center axis of the secondary coil 4b from a center point of the center axis. Here, the "c" is equal to or less than 30, more favorably equal to or less than 20, further more favorably equal to or less than 10, more favorably equal to or less than 5. Furthermore, in this embodiment, the magnetic resonance member 1 is arranged at a center of a width of the secondary coil 4b (i.e. the magnetic resonance member 1 is arranged at a position of substantially same distances from both end surfaces of the secondary coil 4b). Furthermore, it is favorable that in a plane perpendicular to the center axis of the hollow part of the magnet 3, a square measure of a cross section of this hollow part is equal to or larger than hundred times of a square measure of the irradiation area of the excitation light and the measurement light in the magnet resonance member 1; and in particular, it is favorable that a radius of the cross section of this hollow part is equal to or larger than ten times of a radius of the irradiation area of the measurement light. In this embodiment, for example, if the irradiation area of the measurement light has 50 micro meters by 100 micro meters, the cross section of the hollow part is equal to or larger than 500 micro meter by 1000 micrometers. In the aforementioned manner, a uniform static magnetic field (a static magnetic field of substantial constant direction and intensity) is applied to the irradiation area of the excitation light and the measurement light.

Further, for example, as shown in FIG. 6, fluorescence that the magnetic resonance member 1 emits is converged from the magnetic resonance member 1 through the light guide member 42 and the predetermined optical system 43 toward the light receiving device 13. In this embodiment, this optical system 43 includes compound paraboloid type condensers (CPCs) 43*a*, 43*b*, for example, as shown in FIG. 6. This optical system 43 may include another lens configuration. An end surface of the light guide member 42 makes surface contact or makes surface joining (using an adhesive) with an end surface of the CPC 43*a*, and the fluorescence guided by the light guide member 42 is incident to an inner part of the CPC 43*a* through this end surface.

This optical system 43 is configured to prevent the aforementioned incident light (i.e. a residual component that passed through the magnetic resonance member 1) from entering the light receiving device 13. Specifically, as shown in FIG. 6, for example, a dichroic mirror 43*c* that causes the aforementioned fluorescence to pass through and reflects the aforementioned incident light and/or a long pass filter 43*d* that causes the aforementioned fluorescence to pass through and attenuates the aforementioned incident light are/is installed in this optical system 43. The aforementioned incident light reflected by the dichroic mirror 43*c* is detected by a light receiving device 13*a* for reference, and the calculation unit 22 corrects a measurement value of the measurement target magnetic field on the basis of a light intensity of the incident light detected by the light receiving device 13*a* for reference (on the basis of a deviation from a predetermined reference value, for example).

In this embodiment, the irradiating device 12 irradiates the magnetic resonance member 1 with the aforementioned incident light through the light guide member 41 along the aforementioned center axes. Consequently, the incident light is incident to an inner part of the light guide member 41 through an end surface 41*a* of the light guide member 41, and travels toward the magnetic resonance member 1 with reflecting at side surfaces of the light guide member 41. As mentioned, by the light guide member 41, a light path of laser light (the measurement light) from the irradiating device 12 and a space that a light path of the fluorescence from the magnetic resonance member 1 passes through are secured, and the measurement light and the fluorescence do not leak to an external space.

Further, a magnetic shield is installed around the magnetic resonance member 1 of the magnetic sensor unit 10, and thereby a magnetic field from outside is not directly applied to the magnetic resonance member 1.

The following part explains a behavior of the magnetic field measurement apparatus in this embodiment.

As shown in FIG. 3, for a measurement target object 101, the primary coil 4*a* of the flux transformer 4 in the magnetic sensor unit 10 is arranged at a desired measurement position and with a desired orientation. Consequently, a measurement target magnetic field is sensed by the primary coil 4*a*, and an application magnetic field is induced by the secondary coil 4*b* and is applied to the magnetic resonance member 1. In addition, a substantially uniform static magnetic field is applied to the magnetic resonance member 1 by the magnet 3 in the magnetic sensor unit 10.

Further, the measurement control unit 21 controls the high-frequency power supply 11 and the irradiating device 12, and applies microwave from the high-frequency magnetic field generator 2 to the magnetic resonance member 1 and applies laser light (excitation light and measurement light) from the irradiating device 12 through the light guide member 41 to the magnetic resonance member 1, in accordance with a predetermined measurement sequence. The light receiving device 13 receives fluorescence that the magnetic resonance member 1 emits correspondingly to the excitation light and the measurement light, and outputs an electric signal corresponding to a light amount of the fluorescence (fluorescence intensity). The measurement control unit 21 acquires the electric signal, and the calculation unit 22 performs calculation corresponding to the measurement sequence on the basis of the fluorescence intensity and thereby determines the magnetic field (its intensity, its direction, and/or the like) at the measurement position.

Thus, a magnetic field is measured at a measurement position by the magnetic sensor unit 10 (i.e. the magnetic resonance member 1). The magnetic sensor unit 10 may be moved for scanning along a predetermined scanning path pattern and the aforementioned magnetic field measurement may be performed at plural measurement positions on the scanning path.

As mentioned, in the aforementioned Embodiment 1, the high-frequency magnetic field generator 2 applies microwave to the magnetic resonance member 1 capable of an electron spin quantum operation using the microwave. The magnet 3 applies a static magnetic field to the magnetic resonance member 1. The irradiating device 12 irradiates the magnetic resonance member 1 with incident light of a specific wavelength. The flux transformer 4 senses a measurement target magnetic field using the primary coil 4*a* and applies an application magnetic field corresponding to the sensed measurement target magnetic field to the magnetic resonance member 1 using the secondary coil 4*b*. The pillar-shaped light guide member 41 guides the incident light to the magnetic resonance member 1, and the pillar-shaped light guide member 42 guides fluorescence that the magnetic resonance member 1 emits from the magnetic resonance member 1. Further, in a hollow part of the secondary coil 4*b* of the flux transformer 4 and in a hollow part of the aforementioned magnet 3, the magnetic resonance member 1 is arranged between an end surface of the light guide member 41 and an end surface of the light guide member 42.

Consequently, without obstructing light paths of the aforementioned excitation light and the measurement light (and the fluorescence), a magnetic field corresponding to the measurement target magnetic field is enabled to be applied to the magnetic resonance member 1. Therefore, the flux transformer 4 effectively applies the magnetic field corresponding to the measurement target magnetic field to the magnetic resonance member 1 and enables the magnetic measurement. Further, the magnetic resonance member 1, the high-frequency magnetic field generator 2, and the magnet 3 are easily arranged relatively to a direction of a magnetic flux of the flux transformer 4, and a space for irradiation of the laser light can be easily secured.

The following part explains a manufacturing method of the magnetic field measurement apparatus in this embodiment.

Firstly, the magnetic resonance member 1, the high-frequency magnetic field generator 2, the magnet 3 and the flux transformer 4 are prepared.

Subsequently, the high-frequency magnetic field generator 2 is fixed to an unshown circuit board. Further, if a semiconductor substrate such as SiC is used in a view of downsizing, the high-frequency magnetic field generator 2 is installed with the substrate as a single body.

Subsequently, the high-frequency magnetic field generator 2 is fixed by fixing the circuit board, and the secondary coil 4*b* of the flux transformer 4 is arranged such that both ends of the through hole 4*b*2 of the bobbin 4*b*1 face the opening parts 2*c* and 2*d*, respectively. It should be noted that these members are assembled such that one of the arrangement directions of the vacancy in the magnetic resonance member 1 passes through centers of the opening parts 2*c* and 2*d*. Consequently, a magnetic flux that the high-frequency magnetic field generator 2 generates gets perpendicular to at least one of outer surfaces of the magnetic resonance member 1.

Subsequently, the light guide member 41, the magnetic resonance member 1, and the light guide member 42 are inserted to the through hole 4*b*2 of the bobbin 4*b*1 through the opening parts 2*c* and 2*d* and are fixed. Here, this is performed such that the magnetic resonance member 1 is arranged in the center area and the center section of the secondary coil 4*b*. Further, a direction and a position of each of the parts are adjusted to cause the magnetic flux that the high-frequency magnetic field generator 2 generates and the magnetic flux that the secondary coil 4*b* generates to get perpendicular to each other.

Furthermore, the magnet 3 is fixed in the outside of the high-frequency magnetic field generator 2. In addition, the irradiating device 12, the optical system 43, and the light receiving device 13 are separately installed and fixed.

The aforementioned manufacturing method enables a gradual adjustment between the magnetic resonance member 1, the high-frequency magnetic field generator 2 and the magnet 3, and a direction of the magnetic flux of the flux transformer 4, and enables them to be easily arranged relatively to each other, and thereby complex adjustment is not required after the assembly.

Embodiment 2

Figure 7:
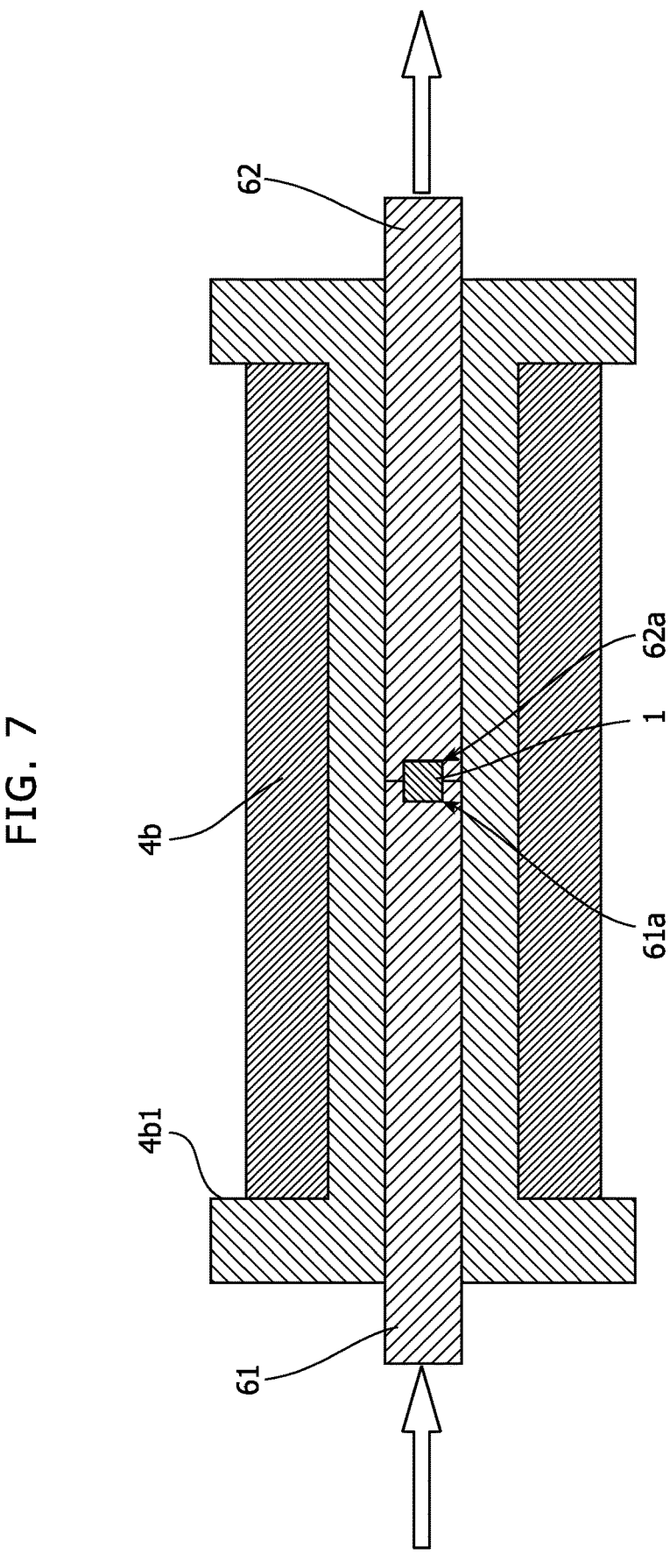
FIG. 7 shows a cross-sectional diagram that indicates an example of light guide members and a magnetic resonance member in a magnetic field measurement apparatus according to Embodiment 2.

FIG. 7 shows a cross-sectional diagram that indicates an example of light guide members and a magnetic resonance member in a magnetic field measurement apparatus according to Embodiment 2. In Embodiment 2, a light guide member 61 and a light guide member 62 are installed instead of the light guide member 41 and the light guide member 42, and only one of the light guide member 61 and the light guide member 62 includes a recess part 61*a* or 62*a* corresponding to a shape of the magnetic resonance member 1 in an end surface of this light guide member or both of the light guide members 61 and 62 include recess parts 61*a* and 62*a* corresponding to a shape of the magnetic resonance member 1 in end surfaces of these light guide members (here, both of them include the recess parts 61*a* and 62*a*). Subsequently, the magnetic resonance member 1 is arranged in the recess part 61*a* or 62*a* or in the recess parts 61*a* and 62*a*.

Specifically, the magnetic resonance member 1 is arranged in the recess part 61*a* or 62*a* or in the recess parts 61*a* and 62*a*, and a part other than the recess part 61*a* in the end surface of the light guide member 61 and a part other than the recess part 62*a* in the end surface of the light guide member 62 make surface contact or make surface joining (using an adhesive) with each other, and thereby these members 61 and 62 are fixed to each other.

Other parts of the configuration and behaviors of the magnetic field measurement apparatus in Embodiment 2 are identical or similar to those in Embodiment 1, and therefore not explained here.

Further, it should be understood that various changes and modifications to the embodiments described herein will be apparent to those skilled in the art. Such changes and modifications may be made without departing from the spirit and scope of the present subject matter and without diminishing its intended advantages. It is therefore intended that such changes and modifications be covered by the appended claims.

For example, in the aforementioned embodiment, the magnet 3 may be an electromagnet.

Further, in the aforementioned embodiment, reflection layers (dielectric multilayers or the like) may be formed on side surfaces of the light guide members 41 and 42. Furthermore, in the aforementioned embodiment, reflection layers (dielectric multilayers or the like) may be formed on side surfaces of the CPCs 43*a* and 43*b*.

Furthermore, in the aforementioned embodiment, the light guide members 41 and 42 may have identical lengths to each other, and a total of the lengths of the light guide members 41 and 42 and a length of the magnetic resonance member 1 may be identical to a length of the through hole 4*b*2 of the bobbin 4*b*1.

Furthermore, in the aforementioned embodiment, on the end surface 41*a* of the light guide member 41 (an end surface in a light incident side of it), an optical member such as a layer may be arranged such that the optical member causes light having a wavelength of the incident light (e.g. 533 nm) to pass through and reflects light having a wavelength of the fluorescence (e.g. 600 nm). In such a case, the fluorescence that travels from the magnetic resonance member 1 to the light guide member 41 reflects at this optical member, travels in the light guide members 41 and 42, and is received by the light receiving device 13.

INDUSTRIAL APPLICABILITY

For example, the present invention is applicable to a magnetic field measurement apparatus and a magnetic field measurement method.

The invention claimed is:

1. A magnetic field measurement apparatus, comprising:
    a magnetic resonance member configured to perform an electron spin quantum operation in response to an application of a microwave;
    a high-frequency magnetic field generator that applies the microwave to the magnetic resonance member;
    a magnet that applies a static magnetic field to the magnetic resonance member;
        an irradiating device that irradiates the magnetic resonance member with incident light of a specific wavelength;
    a flux transformer that senses a measurement target magnetic field using a primary coil and applies an application magnetic field corresponding to the sensed measurement target magnetic field to the magnetic resonance member using a secondary coil;
    a first light guide member that guides the incident light to the magnetic resonance member; and
    a second light guide member that guides from the magnetic resonance member fluorescence that the magnetic resonance member emits;
        wherein the magnetic resonance member is arranged between an end surface of the first light guide member and an end surface of the second light guide member in a hollow part of the secondary coil of the flux transformer and in a hollow part of the magnet.

2. The magnetic field measurement apparatus according to claim 1, wherein the magnet is a ring-type magnet;
    the secondary coil is winded of a ring shape;
    a center axis of the magnet and a center axis of the secondary coil are identical to each other; and
    the magnetic resonance member, the first light guide member, and the second light guide member are arranged on the center axes.

3. The magnetic field measurement apparatus according to claim 2, wherein in a direction of the center axes, the magnetic resonance member is arranged at a center of a width of the ring-type magnet.

4. The magnetic field measurement apparatus according to claim 1, wherein the magnetic resonance member comprises a color center configured to perform an electron spin quantum operation in response to application of the microwave; and the magnet applies a substantially uniform static magnetic field to the magnetic resonance member.

5. A magnetic measurement method, comprising the steps of:

sensing a measurement target magnetic field using a primary coil of a flux transformer;

applying an application magnetic field to a magnetic resonance member configured to perform an electron spin quantum operation in response to application of a microwave, the application magnetic field corresponding to the sensed measurement target magnetic field using a secondary coil of the flux transformer;

applying the microwave to the magnetic resonance member;

applying a static magnetic field to the magnetic resonance member;

guiding incident light of a specific wavelength from an irradiating device to the magnetic resonance member using a pillar-shaped first light guide member; and guiding fluorescence that the magnetic resonance member emits, from the magnetic resonance member using a pillar-shaped second light guide member;

wherein the magnetic resonance member is arranged between an end surface of the first light guide member and an end surface of the second light guide member in a hollow part of the secondary coil of the flux transformer and in a hollow part of the magnet.

*   *   *   *   *